United States Patent [19]

Mannava et al.

[11] Patent Number: 5,174,826
[45] Date of Patent: Dec. 29, 1992

[54] LASER-ASSISTED CHEMICAL VAPOR DEPOSITION

[75] Inventors: Seetha R. Mannava; Ernest B. Cooper, Jr., both of Cincinnati, Ohio

[73] Assignee: General Electric Company, Cincinnati, Ohio

[21] Appl. No.: 802,987

[22] Filed: Dec. 6, 1991

[51] Int. Cl.$^5$ .............................................. C23C 16/00
[52] U.S. Cl. .................................... 118/719; 118/715; 118/722; 118/723
[58] Field of Search ................ 118/715, 719, 722, 723

[56] References Cited

U.S. PATENT DOCUMENTS

| | | | |
|---|---|---|---|
| 4,732,793 | 3/1988 | Itoh | 427/53.1 |
| 4,799,454 | 1/1989 | Kaisha | 118/723 |
| 4,843,030 | 6/1989 | Eden et al. | 437/88 |
| 4,868,005 | 9/1989 | Ehrlich et al. | 427/53.1 |
| 4,910,043 | 3/1990 | Freeman et al. | 427/39 |
| 4,933,207 | 6/1990 | Jensen et al. | 427/53.1 |
| 4,957,773 | 9/1990 | Spencer et al. | 427/39 |
| 4,964,940 | 10/1990 | Auvert et al. | 156/345 |
| 4,981,717 | 1/1991 | Thaler | 427/53.1 |
| 4,987,007 | 1/1991 | Wagal et al. | 427/53.1 |
| 5,017,317 | 5/1991 | Marcus | 264/81 |

*Primary Examiner*—Richard Bueker
*Attorney, Agent, or Firm*—Jerome C. Squillaro; Carmen Santa Maria

[57] ABSTRACT

An apparatus for performing laser-assisted deposition of material on a target surface includes a reaction chamber enclosure having a window therein. The reaction chamber is partially evacuated, and a reactive gas is introduced into the reaction chamber enclosure. A laser directs a laser beam into the interior of the reaction chamber enclosure through the window, and the laser beam causes the reactive gas to react to produce an ionized reaction product gas. Optionally, a catalyst is provided within the reaction chamber enclosure to catalyze this reaction. The ionized gaseous reaction product flows from the interior of the reaction chamber enclosure toward a target surface through a nozzle opening in a wall of the reaction chamber enclosure. A voltage is applied between an electrode in the interior of the reaction chamber enclosure and the target surface to accelerate the ionized reaction product out the nozzle and toward the target surface. The ambient atmosphere in the region of the target surface is controlled by a shroud or an environmental control chamber, to assist in the deposition of the ionized reaction product on the target surface. A further reactive gas may be introduced into the vicinity of the target surface, for deposition of compounds onto the target surface through reaction with the ionized reaction product.

22 Claims, 2 Drawing Sheets

LASER-ASSISTED CHEMICAL VAPOR DEPOSITION

BACKGROUND OF THE INVENTION

This invention relates to the use of laser and photon energy for the deposition of reaction products on surfaces, and, more particularly, to an apparatus and process for generating reactive species and then depositing that reactive species.

Laser-induced decomposition of a reactive gas is a well-known approach for depositing a material onto a surface. In this technique, a laser beam is directed through a vapor which contains a chemically reactive species. The energy of the laser beam activates the chemical reaction or decomposition of the reactive species, causing the formation of a reaction product. If the conditions are proper, the reaction product deposits upon the surface of interest.

The deposition of coatings or layers by this approach is typically accomplished within a deposition chamber. The target surface is placed into the deposition chamber, which is partially evacuated prior to commencing the deposition. Partial evacuation is usually required because the reaction product is likely to recombine prior to deposition if the ambient pressure is too high.

Although the general approach of laser-induced deposition has great potential, process limitations have prevented the full attainment of that potential. The need to place the surface or part that is to be coated into a vacuum chamber, and to pump down the vacuum chamber, slow the production rate. Moreover, the vacuum chamber must be sufficiently large to accommodate the part whose surface is to be coated, effectively limiting the size of the coated part in many practical situations. Moreover, it has been observed that the rate of deposition from a reactive gas using this approach tends to be slow, further limiting the production rate and efficiency of apparatus utilization.

There is a need for an improved approach to depositing coatings, layers, and films using laser-induced deposition techniques. The present invention fulfills this need, and further provides related advantages.

SUMMARY OF THE INVENTION

The present invention provides a process and apparatus for accomplishing laser-assisted deposition of coatings and layers on surfaces. The approach of the invention provides for improved process utilization and economics, by optimizing the reaction and deposition conditions and increasing throughput of articles to be coated. A wide variety of types of coatings may be deposited.

In accordance with the invention, apparatus for performing laser-assisted deposition of material on a target surface comprises a reaction chamber enclosure having a window therethrough and a reaction product ejection nozzle in a wall of the reaction chamber enclosure. The apparatus further includes means for introducing a reactive gas into the interior of the reaction chamber enclosure, and means for partially evacuating the interior of the reaction chamber enclosure. A laser is positioned to direct a beam produced by the laser into the interior of the reaction chamber enclosure through the window. Also included is means for extracting a flow of an ionized gaseous reaction product from the interior of the reaction chamber enclosure through the reaction product ejection nozzle.

According to the present approach, the laser-induced chemical reaction of at least one reactant species is accomplished in the reaction chamber, but deposition of the reaction products occurs outside the reaction chamber. At least one reactant species is injected into the reaction chamber enclosure. Other species as needed can be introduced in a gaseous mixture near the target surface. The reactant species is excited by the energy of the laser beam introduced into the interior of the reaction chamber through the window. Optionally and desirably, a catalyst for the reaction is provided within the reaction chamber to accelerate the laser-assisted reaction. Where provided, the catalyst can be heated by the laser beam, or by an auxiliary heater.

The reaction chamber is maintained in a partially evacuated state. The partial vacuum reduces the recombination rate of the reaction product, thereby increasing the partial pressure of reaction product available for deposition on the target surface. However, the partial vacuum also causes a net inflow of gas into the reaction chamber through the reaction product ejection nozzle or opening, so that the reaction product species cannot escape from the interior of the reaction chamber.

To extract the ionized reaction products from the reaction chamber, an electric potential is applied between the interior of the reaction chamber and the target surface. The applied voltage can be set as high as necessary to accomplish extraction, but typically only a few hundred volts or less is required. The internal electrode can be conveniently supplied as a screen or mesh upon which catalyst material is optionally deposited, while the external electrode is the article having the surface that is to be treated. Preferably, an extraction electrode in the form of a screen or mesh is placed within the reaction chamber between the internal electrode and the article, to aid in accelerating the ionic reaction product toward the article.

The article having the target surface is placed external to the reaction chamber. In a preferred embodiment, the laser, laser window, and reaction product ejection nozzle are aligned, so that the same laser beam that induces the chemical decomposition reaction passes completely through the reaction chamber and impinges upon the target surface to heat it. The stream of excited ionic reaction product flows from the reaction product ejection nozzle to the heated surface of the target, and deposits thereon.

The region of the target surface is desirably maintained at a pressure greater than that within the reaction chamber, because the greater pressure increases the deposition rate and efficiency. However, it is desirable in many cases that the target surface not be exposed to the air during deposition, because the oxygen in the air may react with the depositing reaction species to form an undesirable oxygen-containing coating. Some approach is therefore used to control the atmosphere above the target surface. One preferred technique is to provide an environmental control chamber around the target surface and the reaction product ejection nozzle portion of the reaction chamber. Another approach is to use a shroud or skirt around the stream of reaction product gas.

The environmental control chamber (or the shroud) may be filled with an inert gas such as argon to prevent any further chemical reaction at the point of deposition. Alternatively, the shroud may be filled with a gas such as nitrogen that itself may react with the excited ionic species in the reaction product stream from the reaction chamber at the point of deposition. For example, in one application of the invention the excited reaction product is titanium ions, and the atmosphere is nitrogen. The titanium ions react with the nitrogen atoms at the deposition location to form and deposit titanium nitride, a hardfacing coating material. If the nitrogen were provided in the interior of the reaction chamber as part of the reactant gas flow, the titanium nitride would form inside the reaction chamber and could not be extracted electrostatically.

The present approach permits the reaction chamber to be operated continuously under optimal conditions. The articles having the target surfaces can be moved into position opposite the reaction product ejection nozzle, receive the required treatment, and removed while continuing to operate the deposition apparatus at steady state. Introduction of the articles into the environmental control chamber can be readily accomplished, as there is either no vacuum or a mild vacuum that is readily maintained when changing target surfaces. The use of a shroud where practical further increases the efficiency of the system. Other features and advantages of the invention will be apparent from the following detailed description of the preferred embodiments, taken in conjunction with the accompanying drawings, which illustrate, by way of example, the principles of the invention.

DETAILED DESCRIPTION OF THE PREFERRED EMBODIMENTS

In accordance with a processing aspect of the invention, a process for depositing a material onto a target surface comprises the steps of furnishing a reaction chamber enclosure having a nozzle opening therein, partially and continuously evacuating the interior of the reaction chamber enclosure, and introducing a reactive gas into the partially evacuated reaction chamber enclosure. Deposition is accomplished by exciting the reactive gas within the reaction chamber enclosure with a laser beam to produce an ionized reaction product gas, and applying a voltage between the interior of the reaction chamber enclosure and a target surface located outside of the reaction chamber enclosure. The applied voltage is sufficiently great that ions are accelerated toward the target surface with sufficiently great energy to pass through the nozzle against the flow of gas into the reaction chamber enclosure as a result of the applied partial vacuum.

Figure 1:
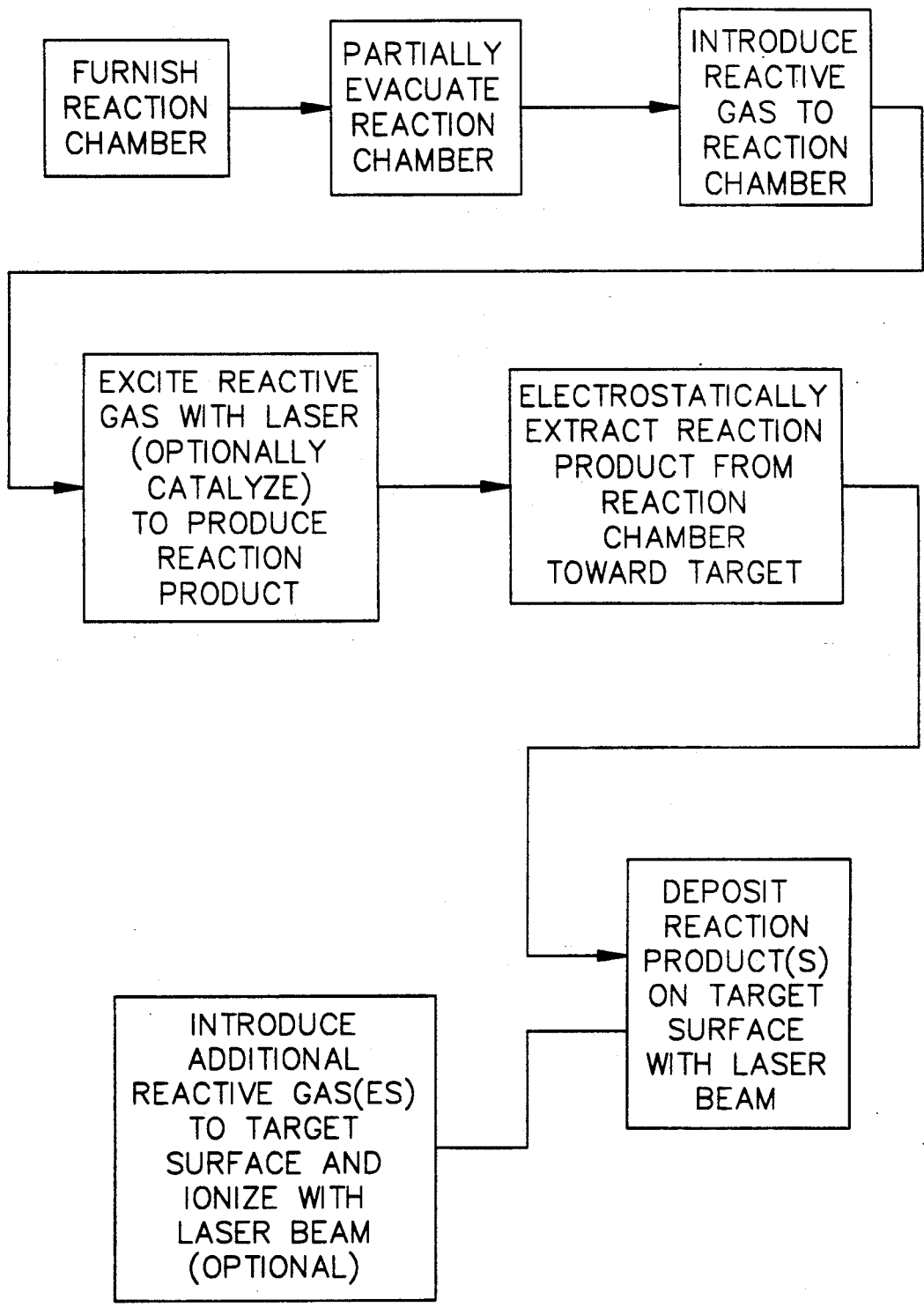
FIG. 1 is a process flow diagram for the process of the invention.
Figure 2:
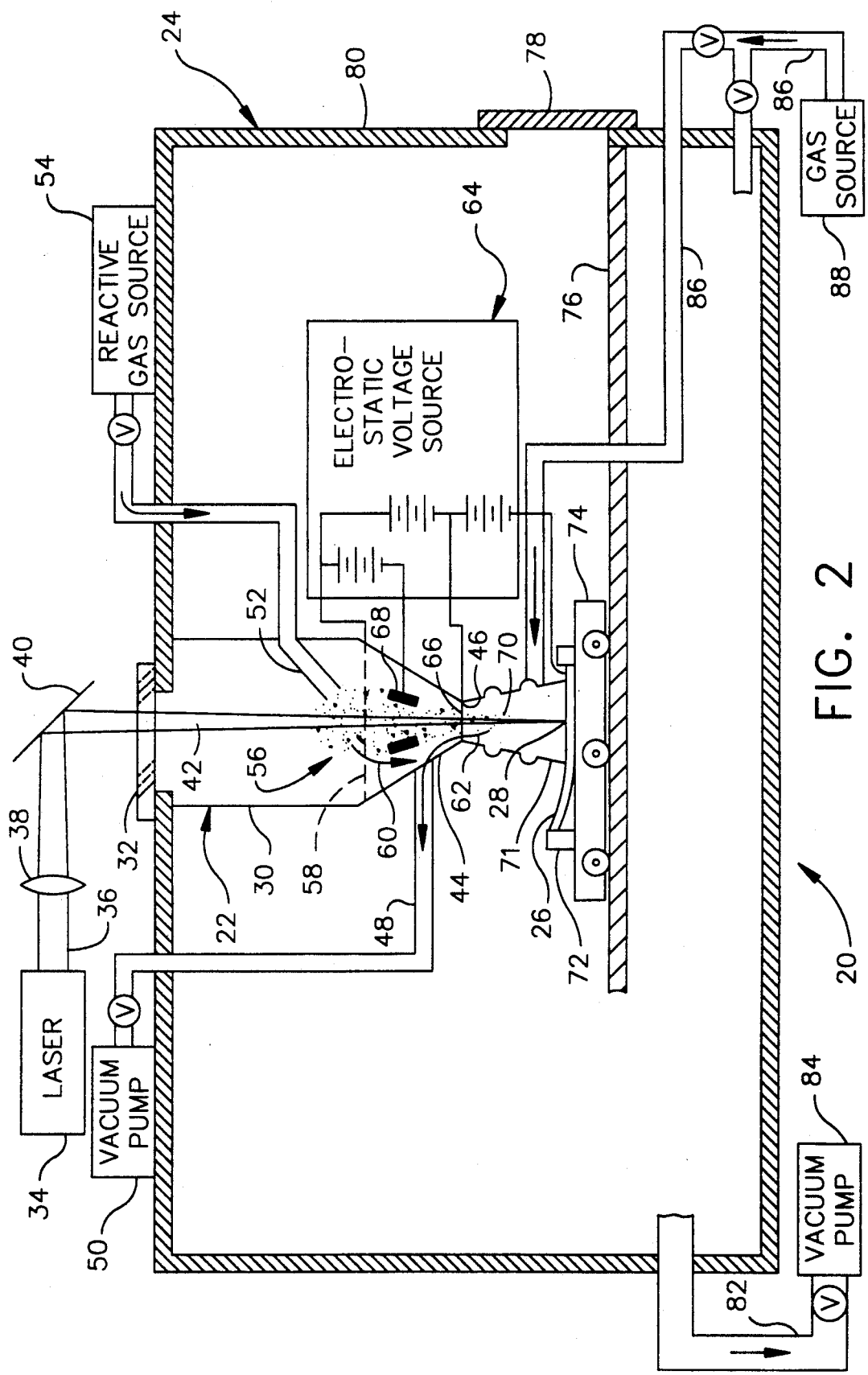
FIG. 2 is a schematic side sectional view of a deposition apparatus of the invention.

FIG. 1 illustrates this process, and FIG. 2 illustrates a preferred apparatus for accomplishing the process. An apparatus 20 includes a reaction chamber 22 in which the reaction product is formed, and an environmental control chamber 24 that receives and contains an article 26 having a target surface 28 upon which deposition is to occur. In the illustrated embodiment, the reaction chamber 22 is enclosed within the environmental control chamber 24, but that need not be the case.

The reaction chamber 22 has a wall 30, which in the illustrated form, is cylindrical. At one end of the cylinder is a window 32 that is transparent to the energy produced by a laser 34. The laser 34 may be any type appropriate to the application, but in a presently preferred embodiment the laser is an excimer laser having a power output of about 100 watts. The laser 34 produces a beam 36 that is shaped and controlled by appropriate optics, depicted schematically as a lens 38, and then directed by a directional control system, depicted schematically as a mirror 40. Lens systems 38 and directional control systems 40 are known in the art of laser systems. The systems 38 and 40 produce a controlled laser beam 42 whose use will be described subsequently.

At the opposite end of the reaction chamber 22, the wall 30 is angled inwardly to form a conical reaction product extraction nozzle 44 having an opening 46 to the interior of the environmental control chamber 24. The target surface 28 is positioned opposite and facing the opening 46 of the nozzle 44 during operation. Desirably, and as illustrated, the nozzle 44 and opening 46 are disposed such that the laser beam 42 passes through the window 32, along the cylindrical axis of the reaction chamber 22, and out of the reaction chamber 22 through the opening 46 of the nozzle 44. The laser beam 42 thereafter strikes the target surface 28 to heat it to a deposition temperature.

In FIG. 2, the lens system 38 and mirror system 40 are set so that the beam focus of the laser beam 42 is at about the opening 46, so that the maximum power density of the laser beam is found at that location. The lens system 38 may be adjusted to move the focal point to a location further within the reaction chamber 22, or to a location outside the reaction chamber 22, and even to the target surface 28 or beyond.

The interior of the reaction chamber 22 is partially and continuously evacuated through a vacuum line 48 extending to a vacuum pump 50. Desirably, the vacuum line 48 pumps from a location within or adjacent the nozzle 44. The vacuum within the reaction chamber 22 is a partial vacuum typically on the order of about 1–10 Torr, and a mechanical forepump can be used as the pump 50.

A reactive gas is introduced into the interior of the reaction chamber 22 through a reactive gas line 52 that extends from a reactive gas source 54, forming a reactive gas cloud 56. The reactive gas line 52 desirably introduces the reactive gas to a location near to the centerline of the reaction chamber 22, into the laser beam 42. In the illustrated embodiment, a single reactive gas line 52 is shown. However, multiple gas lines or manifolds may be used to modify the flow path of the gas, and the reactive gas may be introduced at a number of locations along the path of the beam 42.

The energy of the laser beam 42 causes a chemical reaction to occur in the reactive gas cloud 56. In the chemical reaction, the reactant gas molecules are transformed to reaction product ionic species. To assist in the completion of the chemical reaction, a catalyst appropriate to the particular reaction may be provided. The catalyst is typically a precious metal such as platinum, provided in a finely divided or thin form. It is usually most convenient to coat the catalyst onto a solid substrate such as a screen 58 so that it is in contact with the reactive gas cloud 56 during the laser-induced chemical reaction.

The gas flow induced by the vacuum line 48 tends to draw the gas of the reactive gas cloud 56 into the vacuum line 48, as indicated schematically by an arrow 60. Gas is also drawn from the exterior of the reaction chamber 22 into the vacuum line 48 through the opening 46, as indicated by the arrow 62. The gas flow 62 tends to prevent the reaction product gas from leaving the reaction chamber 22 through the opening 46, by the counterflow of gas.

The ionic reaction product gas is extracted from the interior of the reaction chamber 22 and forced to the vicinity of the target surface 28 by electrostatic forces. An electrostatic voltage source 64 applies an appropriate electrostatic potential between the interior of the reaction chamber 22, and particularly the gas cloud 56, and the target surface 28 of the article 26. For example, if the reaction product species is positively charged, an electrostatic potential is applied such that the target surface 28 is negatively charged with respect to the interior of the reaction chamber 22.

The interior of the reaction chamber 22 is conveniently charged by using the screen 58 (that supports the catalyst, if any) as the interior electrode. More than one interior electrode may be used, as required. In the illustrated embodiment, a hollow annulus 66 which is negatively charged with respect to screen 58 is supplied at the opening 46 to act as an extraction electrode, and an electrostatic lens 68 is placed around the gas cloud 56 to focus it into a relatively narrow flow. These various elements 58, 66, and 68 are connected through the electrostatic voltage source 64. When the reaction product is a positively ionized gas product, the polarity of electrostatic lens 68 should be the same as first charged screen 58, or more positive. For a positively charged gas, the relationship between screen 58, lens 68 and annulus 66 causes the gas to be focused into a narrow stream 70 or beam of positive ions and accelerated through the nozzle 44 toward the workpiece target surface 28.

The stream 70 of ionic product gas leaves the nozzle 44 and is further accelerated toward the target surface 28. That stream 70 can be confined, and intrusion of undesired gases minimized, by placing a skirt or shroud 71 around the stream 70, extending all or a portion of the distance between the nozzle 44 and the target surface 28.

The article 26 and target surface 28 are mounted on a support 72 that can be moved on a track or by another mechanism, as required. In the most general case, the target surface 28 can be both translated and pivoted, to provide full coverage at any desired angle of deposition. The support 72 is mounted on a carriage 74 that moves along a track 76, permitting the article 26 to be inserted and removed through a door 78 in a wall 80 of the environmental control chamber 24. A lock system or continuous conveyor system can be provided as desired. Significantly, it is far easier to introduce new articles 26 into, and remove coated articles from, the interior of the environmental control chamber 24 than would be possible if they were being introduced into and removed from the reaction chamber 22.

The atmosphere in the environmental control chamber 24 may be controlled independent of the atmosphere in the reaction chamber 22. To remove gas from the interior of the environmental control chamber 24, a vacuum line 82 leading to a vacuum pump 84 is provided. To introduce gas into the interior of the environmental control chamber 24 and/or into the interior of the shroud 71, a gas supply line 86 leading from a gas source 88 is provided.

The target surface 28 is heated, preferably by the laser beam 42. When the ionic product gas contacts the heated target surface 28, it deposits as a solid upon that surface 28 and then rapidly cools to form a coating or layer. The use of the laser beam as the energy source for heating the target surface 28 results in the deposition of coating from the ionic product gas only where the surface is strongly heated. Thus, by controlling the relative position of the article 26 and the beam 42, patterns can be written onto the target surface 28 with the deposited reaction products.

The composition of the layer deposited onto the target surface 28 is determined by the reactive gas, the catalyst (if any), the atmosphere within the reaction chamber 22, and the atmosphere within the shroud 71. A number of such reaction systems are known in the art for use with prior laser-induced deposition systems, and these reaction systems are operable for use with the present invention. An illustrative example is helpful in understanding the approach of the invention. In one example of interest, the reactive gas introduced through the reactive gas line 52 is titanium tetrachloride. Under the excitation of an excimer laser beam and in the presence of a platinum catalyst, the titanium tetrachloride decomposes to produce titanium ions, Ti(+4). The titanium ions are accelerated toward the target surface 28 by the voltage source 64, that applies a voltage such that the article 26 is negatively charged with respect to the screen 58. The interior of the environmental control chamber 24 is first evacuated and then filled with a flow of nitrogen gas from the source 88. At the heated target surface 28, the nitrogen gas reacts with the titanium ions so that titanium nitride, TiN is deposited as a coating onto the target surface.

Other illustrative examples include the deposition of silicon carbide from silicon tetrachloride with methane gas; deposition of tungsten carbide from tungsten hexafluoride with methane gas; and deposition of borides from boron trifluoride.

This invention provides an important advance in the art of coating surfaces. Although the present invention has been described in connection with specific examples and embodiments, it will be understood by those skilled in the arts involved, that the present invention is capable of modification without departing from its spirit and scope as represented by the appended claims.

What is claimed is:

1. Apparatus for performing laser-assisted deposition of material on a target surface, comprising:
    a reaction chamber enclosure having a window therethrough and a reaction product ejection nozzle in a wall of the reaction chamber enclosure;
    means for introducing a reactive gas into the interior of the reaction chamber enclosure;
    means for partially evacuating the interior of the reaction chamber enclosure;
    a laser positioned to direct a beam produced by the laser into the interior of the reaction chamber enclosure through the window; and
    means for extracting a flow of an ionized gaseous reaction product from the interior of the reaction chamber enclosure through the reaction product ejection nozzle.

2. The apparatus of claim 1, Wherein the apparatus further comprises
    a catalyst within the reaction chamber enclosure that catalyzes a chemical reaction in a reactive gas introduced into the reaction chamber enclosure through the means for introducing.

3. The apparatus of claim 1, wherein the means for extracting includes means for generating an electrical potential between the interior of the reaction chamber enclosure and the target surface.

4. The apparatus of claim 1, further including a shroud seal that encloses a deposition path extending from the reaction product ejection nozzle to the target surface.

5. The apparatus of claim 1, further including
an environmental control chamber enclosing the target surface and at least a portion of the reaction chamber enclosure.

6. The apparatus of claim 1, further including
means for introducing an additional reactive gas into the vicinity of the target surface.

7. The apparatus of claim 1, wherein the window and the reaction product ejection nozzle are aligned so that the beam directed into the interior of the reaction chamber enclosure through the window leaves the reaction chamber enclosure through the reaction product ejection nozzle.

8. The apparatus of claim 1, further including
means for maintaining the target surface at a partial pressure greater than that within the interior of the reaction chamber enclosure.

9. Apparatus for performing laser-assisted deposition of material on a target surface, comprising:
a reaction chamber enclosure having a window therein;
means for introducing a reactive gas into the interior of the reaction chamber enclosure;
means for partially evacuating the interior of the reaction chamber enclosure;
a laser positioned to direct a beam produced by the laser into the interior of the reaction chamber enclosure through the window; and
means for producing a flow of an ionized gaseous reaction product from the interior of the reaction chamber enclosure toward a target surface, the means for producing including
a nozzle through a wall of the reaction chamber enclosure,
an electrode within the reaction chamber enclosure, and
a voltage source that applies an electrical potential between the electrode and the target surface, a voltage applied by the voltage source being such that ions within the reaction chamber enclosure are accelerated toward the target surface.

10. The apparatus of claim 9, wherein the apparatus further comprises
a catalyst within the reaction chamber enclosure that catalyzes a chemical reaction in a reactive gas introduced into the reaction chamber enclosure through the means for introducing.

11. The apparatus of claim 10, wherein the catalyst is supported on the electrode.

12. The apparatus of claim 9, wherein the electrode is a screen.

13. The apparatus of claim 9, further including a shroud seal that encloses a deposition path extending from the nozzle to the target surface.

14. The apparatus of claim 9, further including
an environmental control chamber enclosing the target surface.

15. The apparatus of claim 9, wherein the window and the reaction product ejection nozzle are disposed so that the beam directed into the interior of the reaction chamber enclosure through the window leaves the reaction chamber enclosure through the nozzle.

16. The apparatus of claim 9, further including
means for introducing an additional reactive gas into the vicinity of the target surface.

17. The apparatus of claim 9, further including
means for focusing the flow of ionized gas as it passes from the reaction chamber enclosure.

18. Apparatus for performing laser-assisted deposition of material on a target surface, comprising:
a reaction chamber enclosure having a window therein;
means for introducing a reactive gas into the interior of the reaction chamber enclosure;
means for partially evacuating the interior of the reaction chamber enclosure;
a laser positioned to direct a beam produced by the laser into the interior of the reaction chamber enclosure through the window; and
a catalyst within the reaction chamber enclosure that catalyzes a chemical reaction in a reactive gas introduced into the reaction chamber enclosure through the means for introducing;
means for producing a flow of an ionized gaseous reaction product from the interior of the reaction chamber enclosure toward a target surface, the means for producing including
a nozzle through a wall of the reaction chamber enclosure, the nozzle being positioned such that the laser beam directed into the interior of the reaction chamber enclosure through the window leaves the reaction chamber enclosure through the nozzle,
an electrode within the reaction chamber enclosure, and
a voltage source that applies an electrical potential between the electrode and the target surface, a voltage applied by the voltage source being such that ions within the reaction chamber enclosure are accelerated toward the target surface; and
means for controlling the ambient atmosphere in the region of the target surface.

19. The apparatus of claim 18, further including
means for focusing the beam of the laser.

20. The apparatus of claim 18, further including
means for moving the target surface relative to the laser beam.

21. The apparatus of claim 18 further including at least a second electrode within the reaction chamber enclosure.

22. The apparatus of claim 18 further including an electrostatic lens for focusing the ionized reaction product.

* * * * *